United States Patent [19]

Codd et al.

[11] Patent Number: 4,558,281
[45] Date of Patent: Dec. 10, 1985

[54] BATTERY STATE OF CHARGE EVALUATOR

[75] Inventors: Roger D. Codd, Shirley; Ronald I. Sims, Solihull; Robert B. Olive, Solihull; Amit S. Jobanputra, Solihull, all of England

[73] Assignee: Lucas Industries, Birmingham, England

[21] Appl. No.: 502,103

[22] Filed: Jun. 8, 1983

[30] Foreign Application Priority Data

Jun. 12, 1982 [GB] United Kingdom ............... 8217140

[51] Int. Cl.$^4$ ............................................. G01N 27/46
[52] U.S. Cl. .................................. 324/433; 324/427; 320/48
[58] Field of Search ............... 324/426, 427, 428, 429, 324/433, 434, 430, 431; 429/90, 91, 92, 93; 320/43, 48

[56] References Cited

U.S. PATENT DOCUMENTS

| | | | |
|---|---|---|---|
| 3,778,702 | 12/1973 | Finger | 324/428 |
| 3,808,522 | 4/1974 | Sharaf | 324/430 |
| 3,886,442 | 5/1975 | Chiku et al. | 324/427 |
| 3,984,762 | 10/1976 | Dowgiallo, Jr. | 324/430 |
| 4,484,130 | 11/1984 | Lowndes | 320/48 |

FOREIGN PATENT DOCUMENTS 0003917 1/1979 European Pat. Off. .
2080550 1/1982 United Kingdom .

Primary Examiner—Michael J. Tokar
Attorney, Agent, or Firm—Ladas & Parry

[57] ABSTRACT

A combined battery state of charge evaluator and motor control system for an electric vehicle comprises a traction battery 10, a motor controller 14, a traction motor 11, a micro computer 16 and an interface circuit 15. The micro computer 16 receives signals representing battery temperature, total battery voltage, and battery current and calculates the charge withdrawn from the battery by integrating battery current and also calculates the remaining charge in the battery as a function of battery voltage. By summing the remaining charge and the charge withdrawn, the present charge storage capacity value of the battery is calculated. The micro computer 16 compares the present charge storage capacity value with a value representing 85% of the nominal charge storage capacity of the battery when new and selects the lower of these two values. The state of charge is then calculated as a function of the charge withdrawn and this lower value and displayed on a meter 34.

When the remaining charge in the battery calculated by subtracting the charge withdrawn from this lower value falls below 6% of the battery capacity, the current supply to the motor 11 is limited to a predetermined percentage of the current demanded by the driver. This predetermined percentage is progressively reduced as the remaining charge falls toward zero.

13 Claims, 25 Drawing Figures

BATTERY STATE OF CHARGE EVALUATOR

This invention relates to a battery state of charge evaluator and particularly, but not exclusively, relates to a state of charge evaluator for the traction battery of an electric vehicle. The invention also relates to a method of evaluating the state of charge of a battery.

Battery state of charge evaluators are already known which are capable of providing signals representative of battery state of charge which may be used, for example, to display the state of charge of a traction battery of an electric vehicle. However, due to the wide spread of the characteristics of the individual cells of a battery, there is considerable difficulty in determining when a battery is fully discharged with sufficient accuracy to prevent either damaging over-discharge or undue restriction in the amount of charge which may be withdrawn from the battery.

For example, state of charge evaluators are known in which the total battery voltage is used to determine the state of charge. With such an evaluator, if the voltage which is deemed to correspond to zero state of charge is set too low there is a possibility that one or more cells within the battery will go into cell reversal before zero state of charge is indicated thereby damaging the cells. Alternatively, if the voltage corresponding to zero state of charge is set too high, there is the possibility that there may still be useful charge retained in all the cells when the state of charge indication has fallen to zero.

In order to overcome the problem associated with basing the state of charge evaluation on total battery voltage, a state of charge evaluator has been proposed in published United Kingdom application No. 2080550 in which a battery pack is divided into a set of sub-packs and the state of charge evaluation is based on the voltage of the sub-pack having the lowest voltage. While such an evaluator improves the accuracy with which end of discharge may be predicted, it suffers from the problem that it permits repeated full discharge of the battery and this may significantly shorten the life of the battery even if cell reversal does not occur.

It is an object of this invention to provide a new or improved battery state of charge evaluator in which the above mentioned problems are overcome or reduced, and it is a further object to provide a new or improved method of evaluating the state of charge of a battery.

According to one aspect of this invention there is provided a battery state of charge evaluator comprising a battery, means response to the battery for determining a value representing the present charge storage capacity of the battery, means for comparing the present charge storage capacity value with a value representing a predetermined percentage of the nominal charge storage capacity of the battery when new and selecting the lower of said two values, and means responsive to the battery for determining the state of charge of the battery in accordance with said lower value.

Thus, in an evaluator constructed in accordance with the present invention, in the early stage of the life of the battery, the state of charge evaluation is based on a predetermined percentage of the nominal charge storage capacity of the battery when new. Then, as the battery ages and the charge storage capacity of the battery falls below the predetermined percentage of the nominal charge storage capacity of the battery when new, a state of charge evaluation is based on the actual charge storage capacity of the battery. It is usual for a battery to be used only in circumstances where its charge storage capacity as it ages is sufficient for the required duty. For example, in the case of an electric vehicle, the daily range would be chosen to be within the capability of the battery in the later stages of its life. Consequently, basing state of charge evaluation on a nominal percentage, for example 85% of the nominal charge storage capacity of the battery when new should not result in under-use of the battery. Also, it has been found that limiting discharge to a predetermined percentage of the nominal charge storage capacity of the battery when new can significantly extend battery life compared to the case where the battery is repeatedly subjected to full depth discharges.

According to another aspect of this invention there is provided a method of evaluating the state of charge of a battery comprising determining a value representing the present charge storage capacity of the battery, comparing the present charge storage capacity value with a value representing a predetermined percentage of the nominal charge storage capacity of the battery when new and selecting the lower of said two values, and determining the state of charge of the battery in accordance with said lower value.

According to a further aspect of this invention, there is provided a combined motor control and battery state of charge evaluator system for an electric vehicle having a main electric traction motor, said system comprising a traction battery for providing power to the traction motor, means for controlling the supply of current to the traction motor, means responsive to the battery for determining a value representing the present charge storage capacity of the battery, means for comparing the present charge storage capacity value with a value representing a predetermined percentage of the nominal charge storage capacity of the battery when new and selecting the lower of said two values, means responsive to the battery for determining the state of charge of the battery in accordance with said lower value, and means interconnected with the control means and state of charge determining means for restricting the current supply to the traction motor when the state of charge as determined by the state of charge determining means falls below a predetermined value.

According to a still further aspect of this invention there is provided a method of discharging a traction battery supplying current to the main traction motor of an electric vehicle, said method comprising determining a value representing the present charge storage capacity of the battery, comparing the present charge storage capacity value with a value representing a predetermined percentage of the nominal charge storage capacity of the battery when new and selecting the lower of said two values, determining the state of charge of the battery in accordance with said lower value, and restricting the current supply to the traction motor when the state of charge as so determined falls below a predetermined value.

This invention will now be described in more detail, by way of example, with reference to the accompanying drawings, in which.

Figure 1:
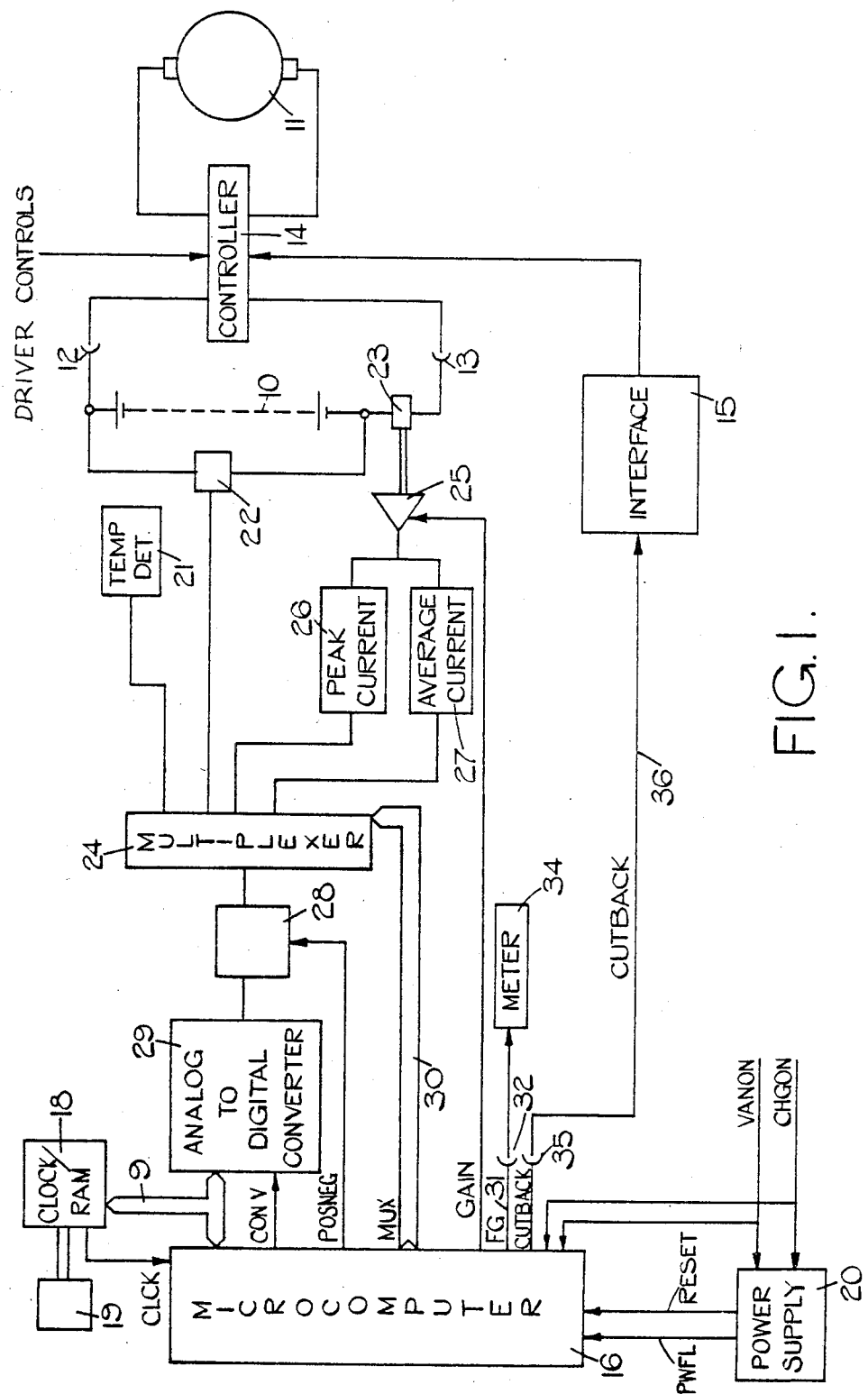
FIG. 1 is a block diagram of a combined motor control and battery state of charge evaluator system embodying this invention.

Referring now to FIG. 1, there is shown the general arrangement of a combined motor control and battery state of charge evaluator system for an electric vehicle. The system includes a lead acid traction battery 10 which is formed from 108 individual battery cells connected in series to provide a nominal output voltage of 216 volts. The battery 10 provides power to a traction motor 11 through detachable connectors 12 and 13 and a controller 14. The controller 14 receives driver controls and also a signal from an interface circuit 15. The controller 14 is described in detail in published Patent Co-operation Treaty Application No. 78/00046 and published United Kingdom patent application No. 2084820.

The combined system includes a micro computer 16. The micro computer 16 comprises a Motorola type 6801. Micro computer 16 has a data bus 9 which is connected to a type MC 146818 combined clock and random access memory (RAM 18. The clock/RAM 18 provides both a clock signal to the micro computer 16 and also data indicating the present time. The clock-/RAM 18 stores the working variables for the micro computer 16 and receives power from an auxiliary power supply 19 which ensures that these variables are not lost when the main power supply for the system is switched off.

The main power supply is indicated at 20. The power supply 20 receives power from the traction battery 10 and supplies power to the various parts of the system. The power supply 20 also receives a pair of signals VANON and CHGON and these signals are also supplied to two of the input ports of the micro computer 16. The power supply 20 supplies two signals PWFL and RESET to two further input ports of micro computer 16. When the vehicle in which the traction battery 10 is installed is in an active state and receiving power from the traction battery 10, the signal VANON is high. The traction battery 10 may be re-charged from an off-board charger and when this charger is connected and switched on the signal CHGON is high. The arrangement is such that only one of the signals VANON and CHGON can be high at any one time. When one of the signals VANON and CHGON goes high, the power supply 20 goes into a powered up state and causes the signal RESET to go high. When one of the signals VANON and CHGON goes low the power supply 20 causes the signal PWFL to go high and then goes into a power down condition in which power is no longer supplied to the various parts of the system.

In order to monitor the traction battery 10, the system includes a temperature detector 21 which senses the temperature of the battery 10, a voltage detector 22 which senses the total on-load voltage of the battery 10, and a current measuring resistor 23 connected between the negative terminal of battery 10 and connector 13. Temperature detector 21 may take the form shown in FIGS. 8a and 8b and U.S. patent application No. 208109, which is assigned to the assignee of the present application. The output of temperature detector 21 is connected to one input of a type CD 4051B multiplexer 24 and the output of voltage detector 22 is connected to a second terminal of this multiplexer. The current measuring resistor 23 is connected across the input terminals of a variable gain amplifier 25 which receives a control signal GAIN from the micro computer 16. During charging, the battery current is relatively low and when the vehicle is being driven the battery current is relatively high. In order to compensate for this, the signal GAIN causes the gain of amplifier 25 to be relatively high during charge and relatively low when the vehicle is being driven. The output of amplifier 25 is supplied to a peak current detector 26 and an average current detector 27, the outputs of which are connected to two further inputs of multiplexer 24. The peak current detector 26 detects peak current both during charging and discharging whilst the average current detector 27 detects average currents in both conditions. The output of multiplexer 24 is connected to the input of a signal processing circuit 28, the output of which is connected to a type ZN 427J-8 analog to digital converter 29. The circuit 28 is capable of either inverting or not inverting the output of multiplexer 24 under the control of a signal POSNEG which it receives from the output of the micro computer 16. Amplifier 25 and detectors 26 and 27 may take the form shown in FIG. 9 of the said U.S. patent application and circuit 28 may take the form shown in FIG. 11 of this application. The micro computer 16 controls the signal POSNEG so that the circuit 28 inverts the output of multiplexer 24 when the current is negative with the result that a positive signal is supplied to the input of the converter 29. The convertor 29 is controlled by a signal CONV which it receives from the micro computer 16. The converter 29 converts the analog signal which it receives from the circuit 28 into a digital signal and this signal is supplied to the micro computer 16 through the data bus 9. The multiplexer 24 receives digital control signals MUX via a bus 30 connected to output port lines of the micro computer 16. The micro computer 16 controls the signals MUX so that the output signals from the temperature detector 21 and voltage detector 22, the peak current detector 26 and the average current detector 27 are each supplied to the analog to digital converter 29 and converted into digital form when required.

An output port of the micro computer 16 supplies a signal FG to a rail 31. The signal FG is a square wave signal the mark space ratio of which indicates the state of charge of the battery 10. The rail 31 is connected through a connector 32 to a meter 34 which is installed on the vehicle. The signal FG drives the meter 34 so that it indicates the state of charge of the battery 10.

Another output port of the micro computer 16 supplies a signal CUTBACK through a connector 35 and a rail 36 to the input of the interface circuit 15. The interface circuit 15 causes the controller 14 to limit the current supply to motor 11 at lower states of charge of battery 10.

The traction battery 10 together with the micro computer 16, the clock/RAM 18, the auxiliary power supply 19, the power supply 20, the temperature detector 21, the voltage detector 22, the current measuring resistor 23, the multiplexer 24, the amplifier 25, the peak current detector 26, the average current detector 27, the circuit 28, and the analog to digital converter 29 may all be removed from the vehicle as a single unit. By arranging these components as a single unit, the micro computer 16 together with the associated components can monitor the battery for its entire life including periods when the battery is not positioned in a vehicle. The micro computer and the associated components may be physically attached to the battery pack.

Figure 2:
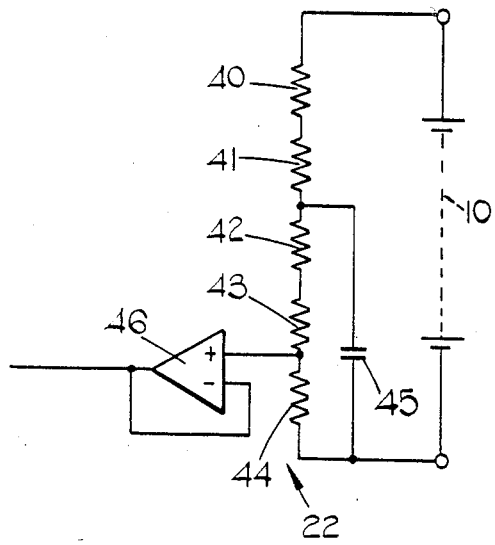
FIGS. 2 and 3 are circuit diagrams of parts of the system shown in FIG. 1.

Turning now to FIG. 2, there is shown the circuit diagram for the voltage detector 22. The detector 22 comprises five resistors 40 to 44 connected in series as a potential divider between the positive and negative terminals of the battery 10. The resistors 42, 43 and 44 are bridged by a capacitor 45 and the junction of resistors 43 and 44 is connected to the non-inverting input of an operational amplifier 46. The output of amplifier 46 is connected to its non-inverting input so that it functions as a voltage follower and the output of amplifier 46 is the output of the circuit 22.

Figure 3:
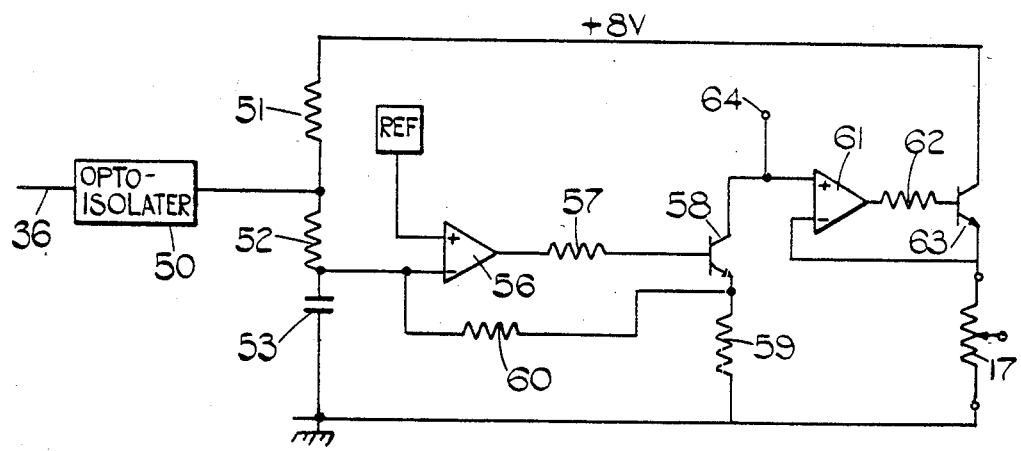

Turning now to FIG. 3, there is shown a detailed circuit diagram of the interface circuit 15. In this circuit, rail 36 is connected to the input of an opto-isolator 50, the output of which is connected to the junction of a pair of resistors 51 and 52. The resistors 51 and 52 are connected in series with a capacitor 53 between the +8 V rail and the earth rail of the circuit shown in FIG. 2 of United Kingdom patent application No. 2084820 and these three elements function as a filter.

The junction of resistor 52 and capacitor 53 is connected to the inverting input of an operational amplifier 56, the non-inverting input of which is connected to a reference voltage. The output of amplifier 56 is connected through a resistor 57 to the base of an NPN transistor 58, the emitter of which is connected to the earth rail by a resistor 59 and the inverting input of amplifier 56 by a feedback resistor 60.

The collector of transistor 58 is connected to the non-inverting input of an operational amplifier 61, the output of which is connected through a resistor 62 to the base of a transistor 63. The collector of transistor 63 is connected to the +8 V rail and its emitter is connected to the inverting input of amplifier 61 and also to one end of the accelerator potentiometer 17 shown in FIG. 2 of application No. 2084820. As explained in application No. 2084820, the voltage appearing on the slider of potentiometer 17 controls the current supplied to the armature of the traction motor.

Amplifier 61 and transistor 63 operate as a buffer and replace the compound emitter follower shown in FIG. 2 of application No. 2084820. Also, the signals which are connected to the input of the compound emitter follower, and which controls the voltage supplied to the accelerator potentiometer 17 in the arrangement shown in FIG. 2 of application No. 2084820, are connected in the present arrangement via a terminal 64 to the non-inverting input of amplifier 61.

The signal CUTBACK is a square wave signal the mark space ratio of which is controlled by the micro computer 16. As is explained below with reference to the sub-routine CUTBACK, when the remaining charge in the battery is equal to or greater than 10 Ah the mark space ratio of the signal CUTBACK is set to a value such that the current supplied to the motor 11 corresponds to that demanded by the driver. 10 Ah is approximately equal to 6% of the nominal capacity of battery 10. When the remaining charge falls below 10 Ah the mark space ratio is varied so that the current supplied to the motor is limited to a percentage of the current demanded by the driver, this percentage being reduced linearly from 100% to 40% as the remaining charge falls from 10 Ah to 0 Ah. Thus, the driver will experience a progressive deterioration in the performance of the vehicle and this deterioration will be experienced at all positions of the accelerator pedal.

Figure 4:
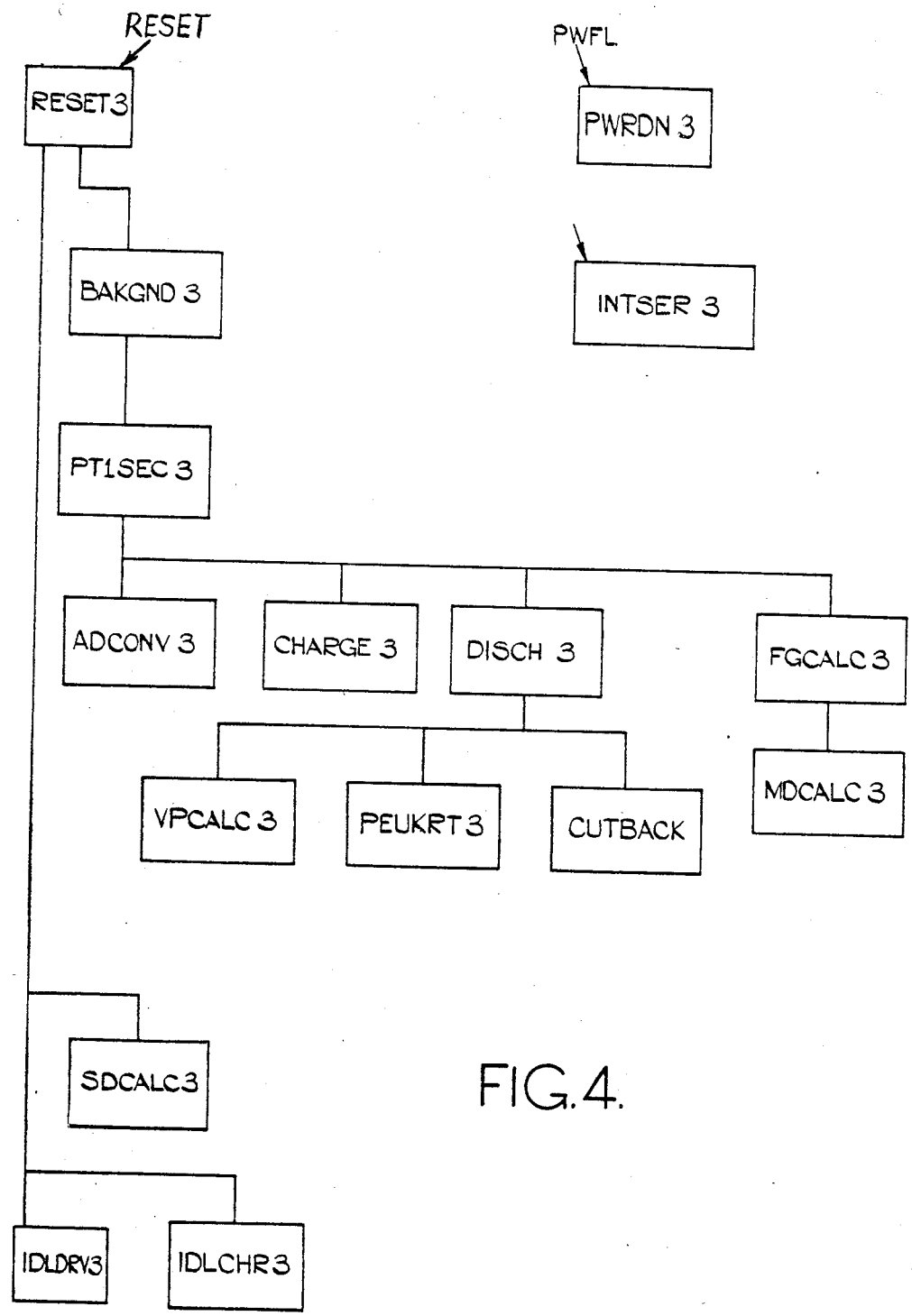
FIG. 4 is a block diagram of the computer programme used in the system shown in FIG. 1.
Figure 5:
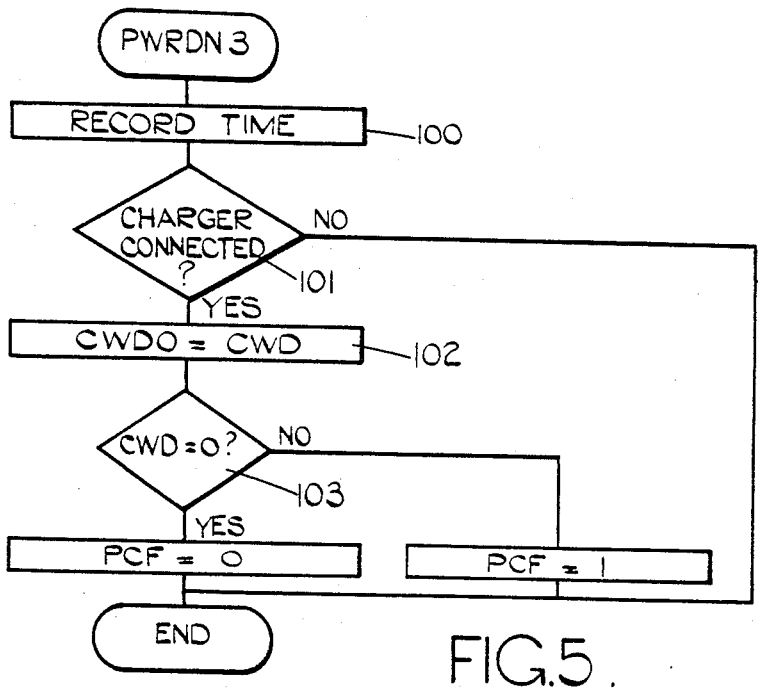
FIGS. 5 to 23 are flow charts and associated graphs of this programme.

The programme for operating the micro computer 16 is stored in the read only memory which forms part of the micro computer. The structure of this programme is shown in block diagram form in FIG. 4. This programme includes a routine PWRDN3 which is performed when the signal PWFL goes high, an interrupt service routine INTSER3 and a routine RESET3 which is performed when the signal RESET goes high. The routine RESET calls a sub-routine SDCALC3 and then calls either a sub-routine IDLDRV3 or sub-routine IDLCH3 before calling a sub-routine BAKGND3. The sub-routine BAKGND3 calls a sub-routine PT1SEC3 which in turn calls sub-routines ADCONV3, CHARGE3, DISCH3 and FGCALC3. The sub-routine DISCH3 also calls sub-routine VPCALC3, CUTBACK and PEUKRT3. The sub-routine FGCALC3 calls a sub-routine MDCALC3.

The programme will now be described in detail.

As explained above, the routine PWRDN3 is entered when the signal PWFL goes high and this occurs usually when either the vehicle power is switched off or the charger power is switched off. At the beginning of this routine, in a step 100, the time is recorded and then in a step 101 a test is made to see if the charger is connected. If the charger is not connected the programme ends. If the charger is connected, in a step 102, a variable CWDO is set to the present value of a variable CWD. As will be explained in more detail below, the variable CWD represents the charge which has been withdrawn from the battery 10. If the variable CWD is equal to zero, this implies that the battery has been fully-recharged and so a flag PCF is cleared before the programme ends. If the variable CWD is not equal to zero, then the flag PCF is set before the programme ends.

Figure 6:
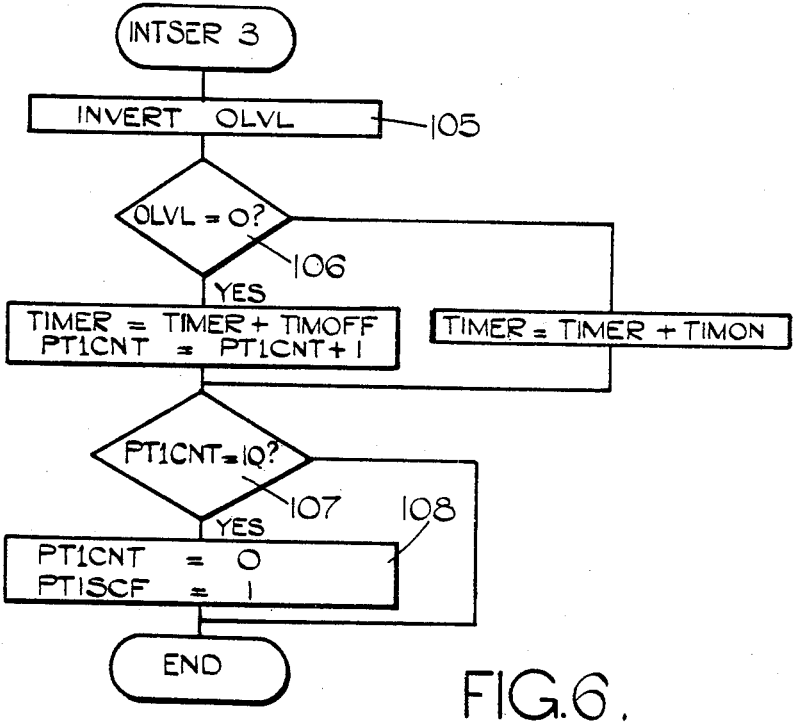

The interrupt routine INTSER3 shown in FIG. 6 will now be described. The micro computer 16 has an output compare register TIMER and a free running counter driven by clock pulses from the clock/RAM 18. The microcomputer also has a bit OLVL which is associated with the output port connected to rail 31 and which provides the signal FG. When the output of the free running counter is equal to the output compare register TIMER the present value of the bit OLVL is output to this port and an interrupt occurs which causes the routine INTSER3 to be entered. The routine INTSER3 inverts the bit OLVL and sets the output compare register TIMER in accordance with two variables TIMON and TIMOFF which are calculated in the programme FGCALC3 in accordance with the state of charge of the battery 10. In this way, the mark space ratio of the signal FG is caused to vary in accordance with the state of charge of the battery. The period of the signal FG is 10 mS and the programme INTSER3 counts ten such periods and then sets a flag PT1SCF. As will be explained in more detail below, the routine BAKGND3 examines the flag PT1SCF and when it is set calls the routines PT1SEC3, ADCONV3, CHARGE3, DISCH3, and FGCALC3. In this way, these routines are performed at intervals of 0.1 S.

The flow chart for the routine INTSER3 will now be described in more detail. After this routine has been entered, in a step 105, the bit OLVL is inverted. Then, in a step 106, the bit OLVL is examined. If this bit is equal to zero, then the output compare register TIMER is increased by the present setting of the variable TIMOFF and a counter PT1CNT is incremented. If the bit OLVL is equal to 1, then the output compare register TIMER is increased by an amount equal to the variable TIMON. The routine then continues with a step 107 in which the counter PT1CNT is examined. If the counter PC1CNT is equal to 10, in a step 108 it is reset to zero and the flag PT1SCF is set.

Figure 7:
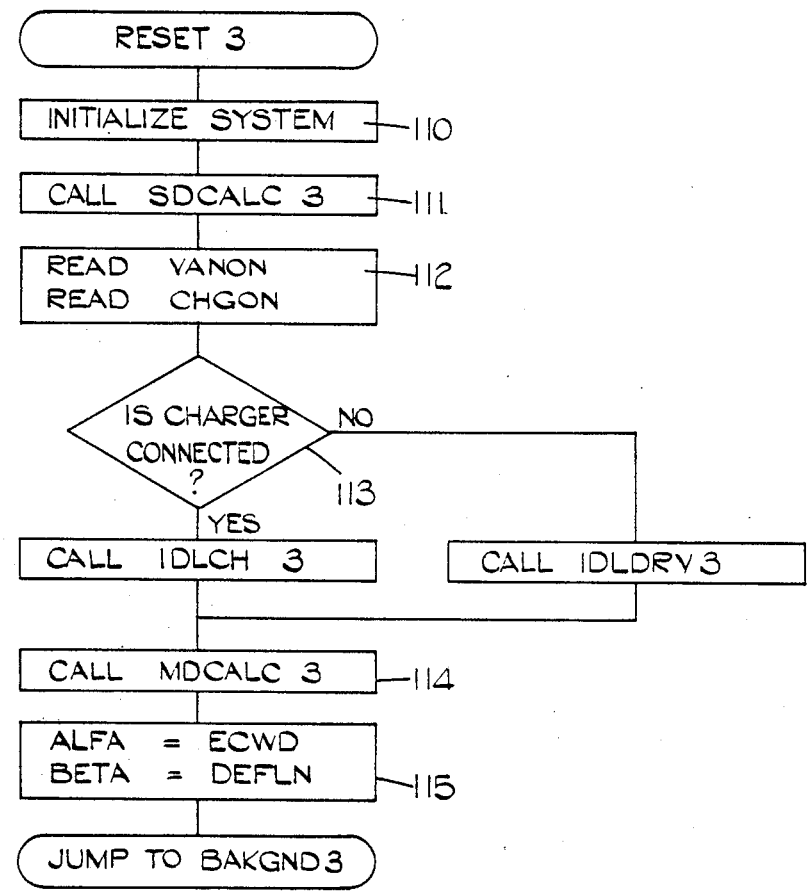

The flow chart for the routine RESET3 is shown in FIG. 7. As explained above, this routine is entered when either of vehicle power is switched on or the charger is switched on. After this programme has been entered, in a step 110 the system is initialised, then, in a step 111 the sub-routine SDCALC3 is called. This sub-routine calculates the self discharge which occurs whilst the battery is idle. In a step 112, the signals VANON and CHGON are read and then in a step 113 a test is made to determine if the charger is connected. If the charger is connected, the sub-routine IDLCH3 is called and if it is not connected the sub-routine IDLDRV3 is called. Subsequently, in a step 114, the sub-routine MDCALC3 is called and this sub-routine calculates a variable DEFLN which represents the state of charge of the battery 10. In a step 115, a variable ALFA is set to the present value of a variable ECWD and a variable BETA is set to the present value of the variable DEFLN. As will be explained in more detail below, the variable ECWD represents the charge which has been withdrawn from the battery 10 compensated to take account of the rate at which the charge is withdrawn. A jump is then made to the sub-routine BAKGND3.

Figure 8:
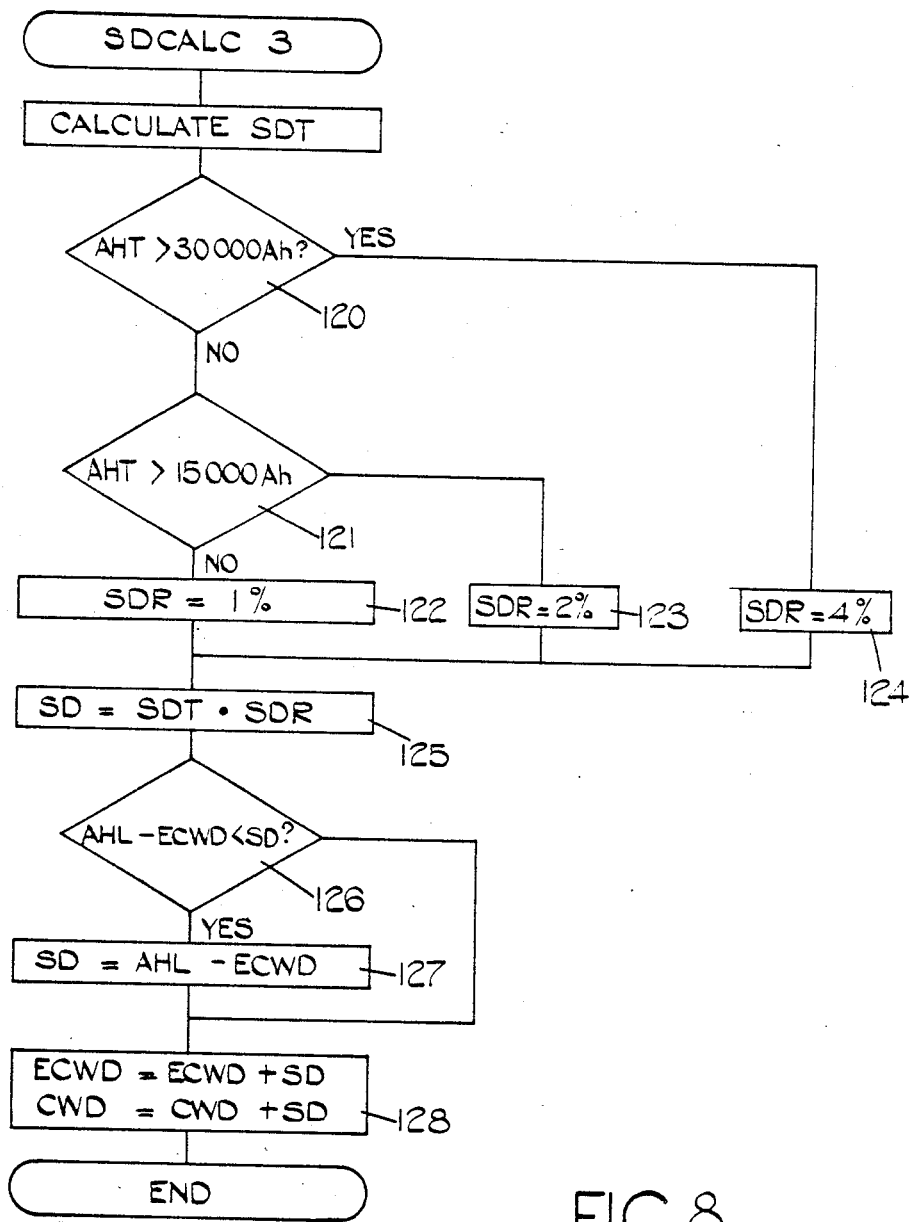

The flow chart for the sub-routine SDCALC3 is shown in FIG. 8. After this sub-routine has been entered, a variable SDT is calculated. This variable represents the time for which the battery has been idle and is calculated by comparing the time recorded in step 100 during the last execution of a programme PWRDN3 with the value of the present time as provided by the clock/RAM 18. In a set of steps 120 to 124, a variable AHT is examined and a variable SDR is set accordingly. The variable AHT represents the total discharge which has occurred during the life of the battery 10 and the variable SDR represents the rate at which the battery self discharges when it is idle. The self discharge rate of the battery increases during its life. In the present example, if the variable AHT is greater than 30000 Ah, the variable SDR is set to a value which corresponds to a daily discharge rate of 4% of the nominal charge storage capacity of the battery when new, if AHT lies in the range 15000 to 30000 Ah the variable SDR is set at a value which corresponds to a daily discharge rate equal to 2% of this capacity, and if it is less than 15000 Ah SDR is set to a value which is equal to a daily discharge rate which corresponds to 1% of this capacity. Next, in a step 125 a variable SD is calculated as a product of the variables SDT and SDR. The variable SD represents the self discharge which has occurred during the preceding idle period of the battery.

Then, in a step 126, the variable ECWD is subtracted from a variable AHL. The variable AHL represents the present charge storage capacity of the battery and consequently the difference between these two variables represents the remaining charge in the battery. If this difference is less than the variable SD, in a step 127 the variable SD is set equal to this difference. Lastly, in a step 128, both the variables ECWD and CWD are increased by an amount equal to the variable SD.

Figures 9, 10:
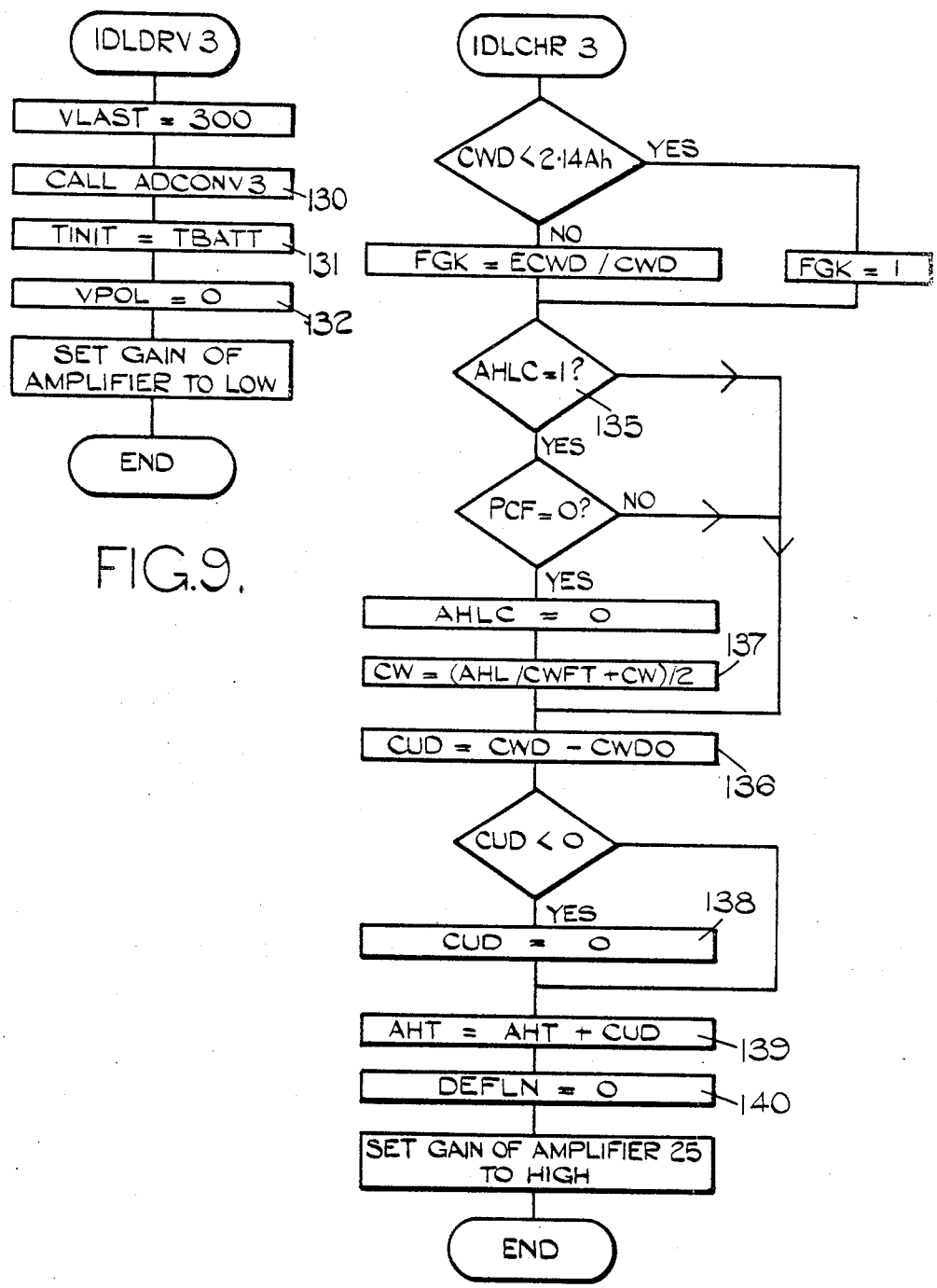

The flow chart for the sub-routine IDLDRV3 is shown in FIG. 9. After this programme has been entered, a variable VLAST used in the sub-routine DISCH3 is set equal to 300 volts. Then, in a step 130, the sub-routine ADCONV3 is called. Next, in a step 131, a variable TINIT is set equal to the present value of the variable TBATT. The variable TBATT represents the temperature of the battery as sensed by the temperature detector 21. Then, in a step 132, a variable VPOL also used in the sub-routine DISCH3 is set equal to zero. Lastly, the gain of amplifier 25 is adjusted to its low setting.

The programme IDLCHR3 is executed each time the charger is switched on and the flow chart is shown in FIG. 10. After this programme has been entered, the variable CWD is examined. If this variable is less than 5.3 Ah, a variable FGK is set equal to 1 and if it is greater than this value the variable FGK is set to ECWD/CWD. The variable FGK is used in the programme CHARGE3. As will be explained in more detail below, in the sub-routine DISCH3 a new value for the variable AHL is calculated under certain conditions during the last part of discharge. When a new value is so calculated, a flag AHLC is set and in a step 135 in the present sub-routine this flag is examined. If the flag is not set, the programme jumps to a step 136. If the flag is set, the flag PCF is examined. If the flag PCF is set the programme jumps to step 136. If the flag PCF is not set, the flag AHLC is reset and then in a step 137 a new value for a variable CW is calculated as the average of the present value of the variable CW and AHL/CWFT. The variable CW represents the present charge storage capacity of the battery normalised to a temperature of 30° C. and the variable CWFT is a function of temperature used to calculate AHL from CW. Thus, providing the previous charging cycle was completed and a new value of AHL was calculated during discharge, the value of CW is corrected and updated so that it corresponds closely to the actual storage capacity of the battery, which may be expected to fall during its working life. By correcting the value of CW, the accuracy of the state of charge calculation discussed below is improved.

In step 136, a variable CUD is set equal to the difference between the variables CWD and CWD0. As CWD0 was set equal to CWD when the charger was previously switched off, the variable CUD represent the discharge which has occurred since that time. In two steps 137 and 138 the variable CUD is examined and set equal to zero if it is negative. Then, in a step 139 the variable AHT is increased by CUD and in this way the variable AHT represents the total discharge which has occurred during the life of the battery. In a step 140, the variable DEFLN is set equal to zero and lastly the gain of amplifier 25 is adjusted to its high setting.

Figure 11:
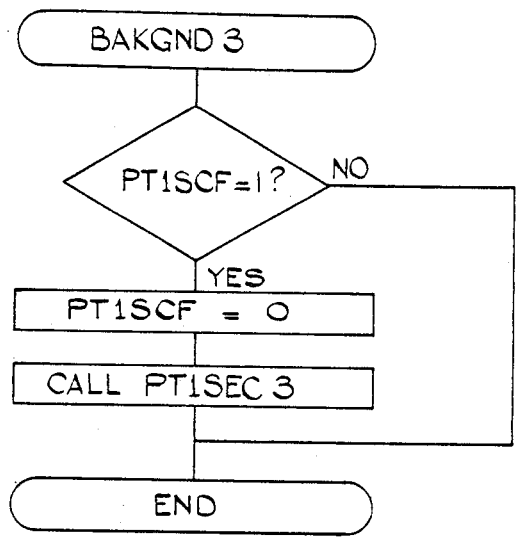

The sole function of the sub-routine BAKGND3 shown in FIG. 11 is to examine the flag PT1SCF and to call the programme PT1SEC3 when this flag is set.

Figure 12:
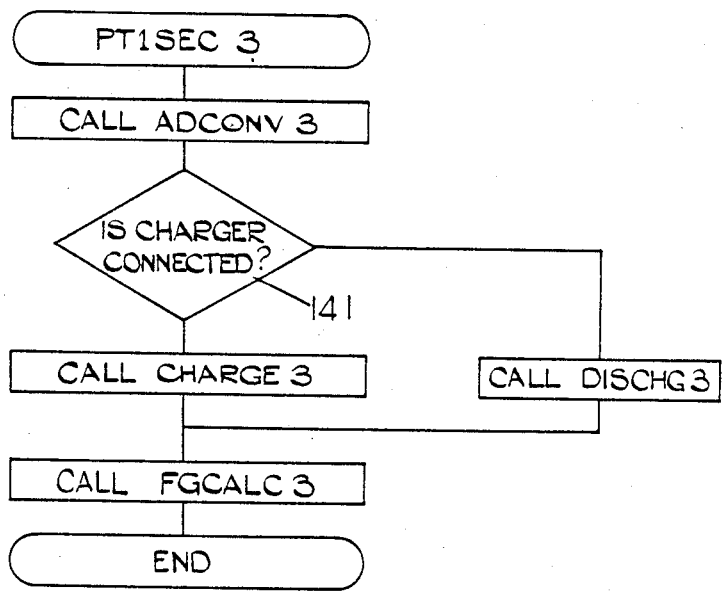

The flow chart for the sub-routine PT1SEC3 is shown in FIG. 12. After this programme has been entered, the sub-routine ADCONV is called and then in a step 141 test is made to see if the charger is connected. If the charger is connected, the sub-routine CHARGE3 is called whilst if it is not connected the sub-routine DISCHG3 is called. Lastly, the sub-routine FGCALC3 is called.

Figure 13:
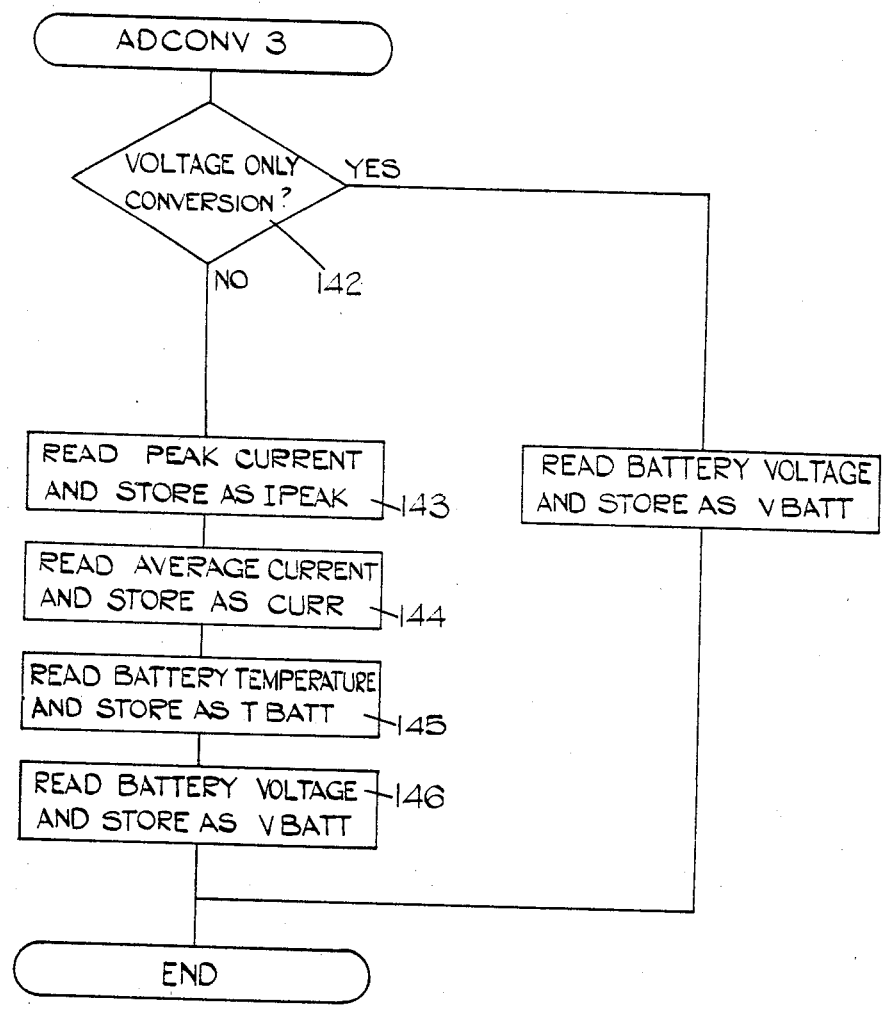

Turning now to FIG. 13, there is shown the flow chart for the sub-routine ADCONV3. In this sub-routine the various analog signals are converted into digital form and stored in the memory of the micro computer. It is important that any readings of the battery voltage which are subject to gross error due, for example, to noise are discarded and not used in the sub-routine DISCHG3 in determining the state of charge of the battery. Voltage readings are therefore checked to determine if they are within expected limits of the previous value. If not, a further conversion of the voltage is made. Consequently, the sub-routine ADCONV3 includes provision for a voltage only conversion.

After this sub-routine has been entered, in a step 142, a test is made to see if a voltage only conversion is required. If voltage only conversion is required, the total battery voltage is read and stored as variable VBATT. Otherwise, in a set of steps 143 and 146, the peak battery current, the average battery current, the battery temperature and the total battery voltage are read and stored as variables IPEAK, CURR, TBATT AND VBATT respectively. The peak and average battery currents are stored in positive values for charging currents and as negative values for discharge currents.

Figure 14:
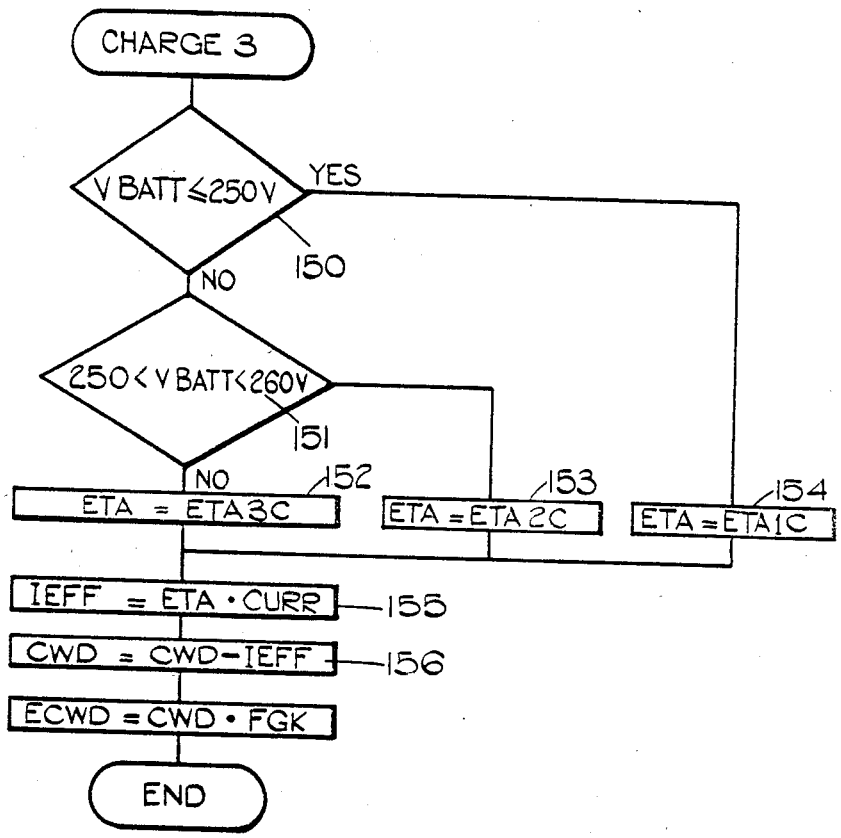

The sub-routine CHARGE3 monitors the battery temperature and charging and reduces the variable CWD and ECWD in accordance with the charge which is supplied. As shown in FIG. 14, after this programme has been entered in a set of steps 150 to 154 VBATT is examined and the variable ETA is set accordingly. The variable ETA represents the charging efficiency and as is known, charging efficiency falls with increased battery voltage. The variable ETA is set to a value of ETA3C if the battery voltage is greater than 260 volts, to a value ETA2C if the battery voltage lies within the range 250 volts to 260 volts, and to a value ETA1C if the battery voltage is less than 250 volts. These voltages depend on the charging current and in this example it is assumed that the charging current is 30A, when the battery voltage is less than 250 V, 20 to 30 A when the voltage lies in the range 250 to 260 V, and 10 to 20 when the voltage exceeds 260 V. Then, in a step 155, a variable IEFF is calculated as a product of ETA and CURR. The variable IEFF represents the charging current compensated to take account of the charging efficiency. Next, in a step 156, the variable CWD is reduced by IEFF. In a step 156, the variable ECWD is calculated as a product of CWD and FGK. FGK was calculated in the programme IDLCHR3 and thus the variable ECWD falls linearly to zero with the variable CWD.

Figure 15A:
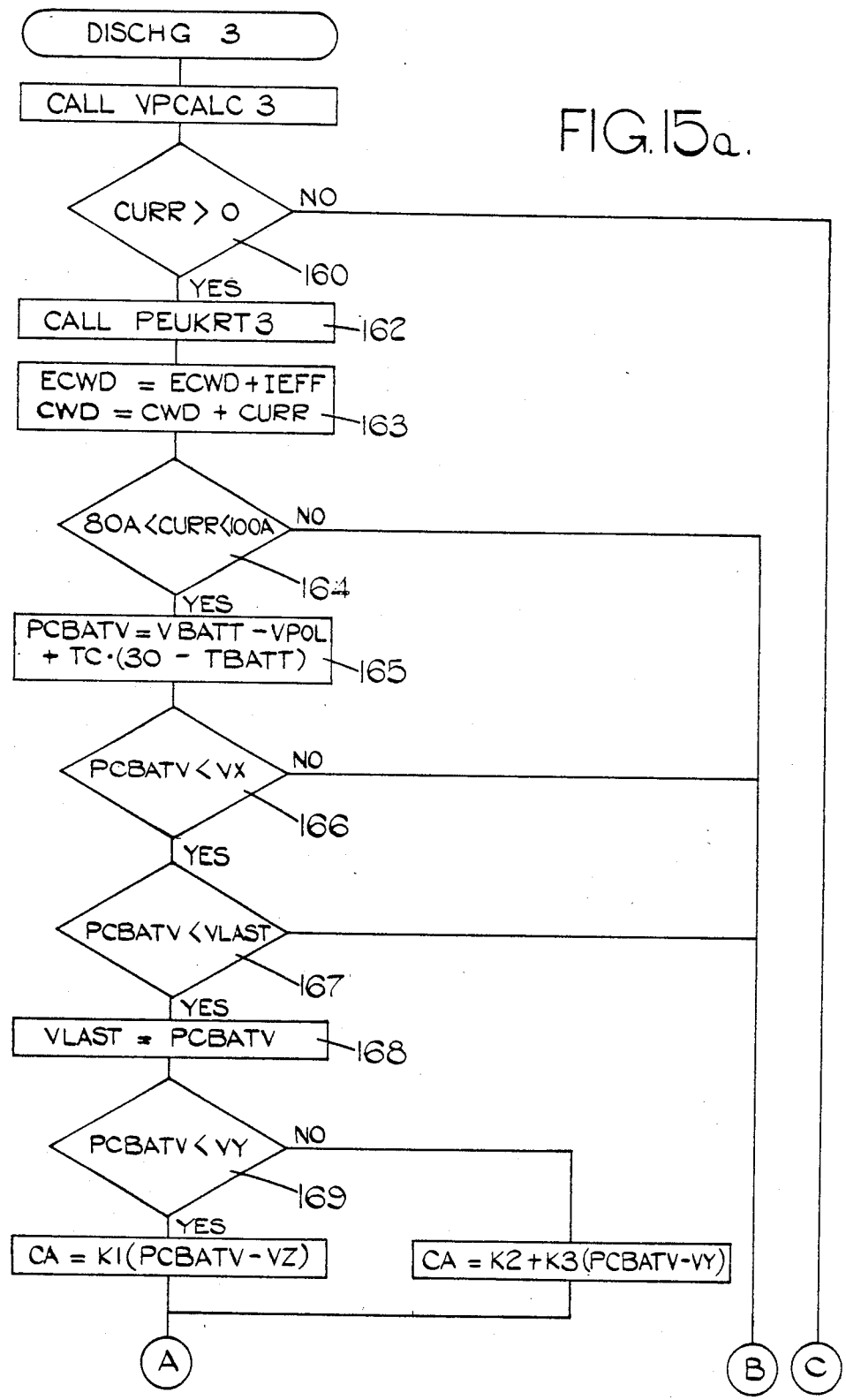
Figure 15B:
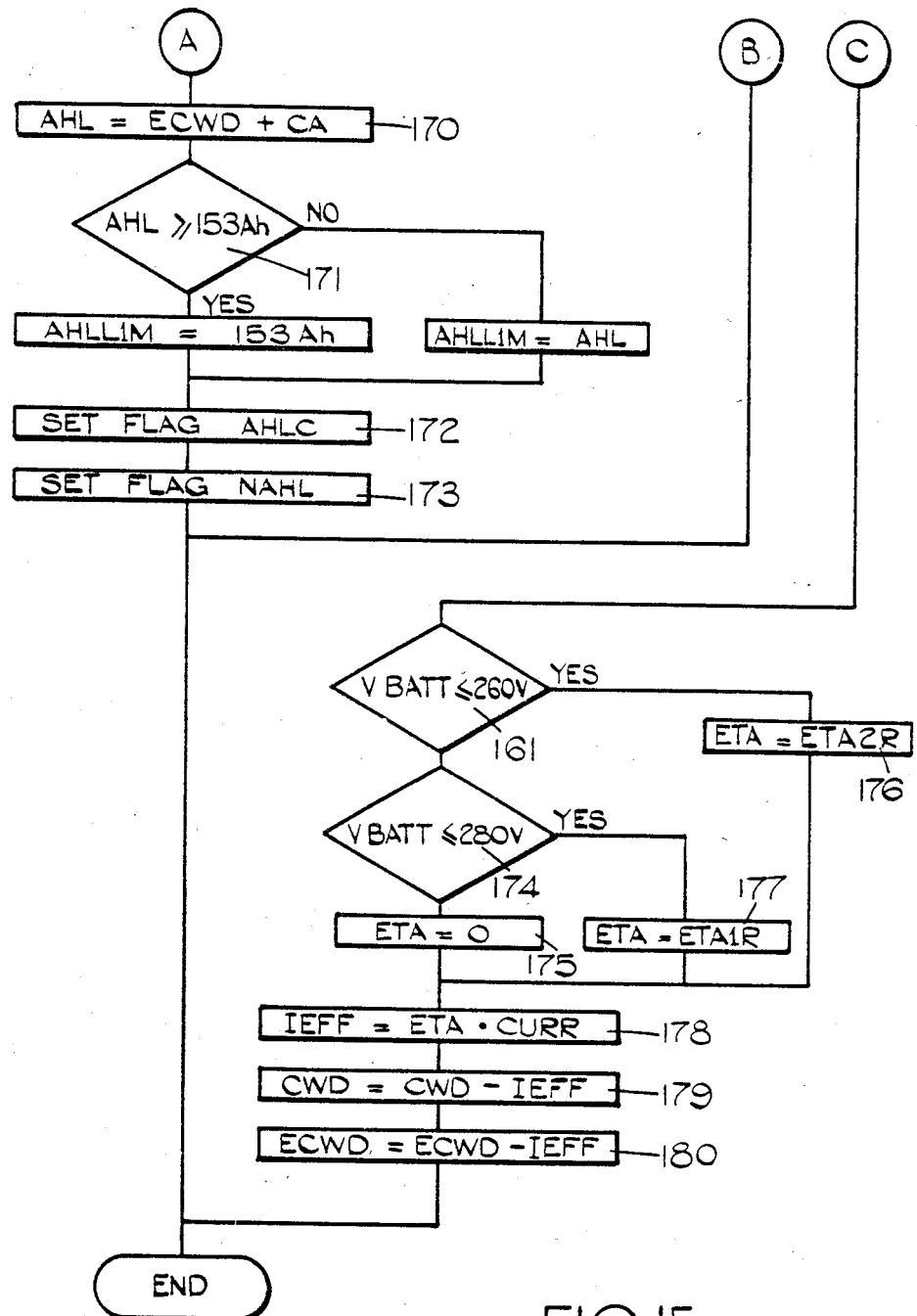

The flow chart for the sub-routine DISCHG3 is shown in FIG. 15. After this sub-routine has been entered, the routine VPCALC3 is called to calculate the polarisation voltage which is stored as the variable VPOL. Then, in a step 160, the variable CURR is examined to determine if the battery is being discharged, in which case this variable is negative, or if it is being recharged which will be the case during regenerative braking and in which case the variable would be positive. If CURR is positive, then the jump is made to an operation 161 whilst if it is negative the sub-routine continues with a step 162. It is to be noted that in the remainder of this sub-routine and also in the sub-routine PEUKRT3 all references to the variable CURR refer only to its magnitude. In step 162, the sub-routine PEUKRT3 is called and this calculates the variable IEFF which represents the discharge current corrected in accordance with the rate of discharge. In a step 163, the variable ECWD is increased by an amount equal to the variable IEFF and the variable CWD is increased by an amount equal to the variable CURR. Battery voltage falls more rapidly towards the end of discharge and becomes progressively a more reliable parameter for estimating the remaining available charge of the battery. In the next part of this sub-routine, providing three conditions are fulfilled, the voltage of the entire battery is used to determine the remaining charge of the battery and this is then used to calculate the charge storage capacity.

The first condition is that the discharge current lies in the range 80 A to 100 A and this condition is examined in step 164. If the current lies outside this range, a jump is made to the end of the sub-routine and if the current lies within this range the routine continues with a step 165. In step 165, a variable PCBATV is calculated. The variable PCBATV represents the battery voltage compensated to allow for the polarisation voltage and normalised to a battery temperature of 30° C. The variable PCBATV is calculated in accordance with the following equation:

$$PCBATV = VBATT - VPOL + TC.(30 - TBATT)$$

In this equation, the variable TC represents the battery temperature coefficient and this has a value of 291 mV/°C.

The next condition is that the battery voltage thus compensated is less than a value VX. The value VX represents the greatest voltage at which the remaining charge of the battery can be calculated accurately. This condition is tested in a step 166 and if the battery voltage is greater than the value VX a jump is made to the end of the sub-routine. If the battery voltage is less than VX then the routine proceeds with a step 167.

The third condition is that the battery voltage as represented by the variable PCBATV is less than a variable VLAST. The variable VLAST represents the value of the variable PCBATV on the previous occasion when this variable was used to calculate the remaining charge. This condition is tested in step 167 and if the variable PCBATV is not less than the variable VLAST a jump is made to the end of the sub-routine. If the variable PCBATV is less than the variable VLAST, the programme proceeds with a step 168 in which the variable VLAST is set to the present value of the variable PCBATV.

Figure 16:
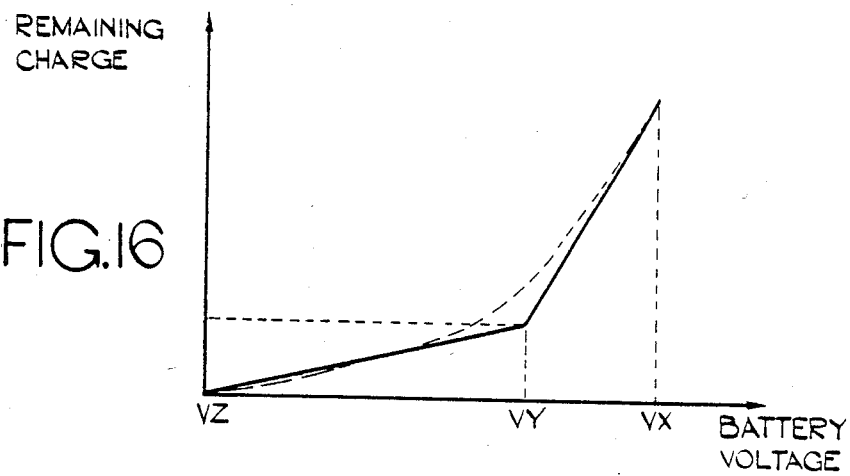

Providing all three conditions are fulfilled, the remaining charge is then calculated as a function of the battery voltage. The relationship between the remaining charge and the battery voltage is shown in FIG. 16. In FIG. 16, the dashed line represents the actual discharge characteristic of the battery whilst the solid line represents the straight line approximation which is used in the present sub-routine. In order to calculate the variable CA in accordance with this straight line approximation, in a step 169 the variable PCBATV is compared with a constant VY and if it is less than this constant the remaining charge is calculated in accordance with the following equation:

$$CA = K1 \, (PCBATV - VZ)$$

If the variable PCBATV is greater than the constant VY, the variable CA is calculated in accordance with the following equation:

$$CA = K2 + K3 \, (PCBATV - VY)$$

In the equations given above for calculating the variable CA, K1, K2, K3, VX, VY and VZ are constants. The constants VX, VY and VZ are shown on FIG. 16.

After calculating the remaining charge as represented by the variable CA, the programme continues with a step 170. In the step 170, the present charge storage capacity of the battery is calculated by summing the variables ECWD and CA.

As will be explained in more detail below, in the sub-routines FGCALC3 and MDCALC3 the state of charge of the battery is calculated in accordance with a variable AHLL1M. In a step 171, the variable AHL is examined and if it is greater than or equal to 153 Ah AHLL1M is set to 153Ah. If it is less than this value, AHLL1M is set equal to AHL. 153 Ah corresponds to 85% of the battery capacity where the battery is new.

Then, in a step 172, the flag AHLC is set to indicate that a new value has been calculated for the variable AHL from the battery voltage and in a step 173 a flag NAHL is set to indicate that a new value of AHL calculated from the battery voltage is available. Both of these flags are used in the sub-routine FGCALC3. The sub-routine then jumps to its end.

As mentioned above, if it is found in step 160 that CURR is positive a jump is made to step 161. In steps 161 and 174 to 177 the variable VBATT is examined and a variable ETA is set accordingly. The variable ETA represents the charging efficiency and is set to a value of zero if the battery voltage is greater than 280 V, to a value of ETA1R if the battery voltage is between 260 V and 280 V, and to a value ETA2R if the battery voltage is less than 260 V. Next, in a step 178, the variable IEFF is calculated as the product of ETA and CURR. The variable IEFF as calculated represents the charging current compensated to take account of the charging efficiency. Lastly, in steps 179 and 180, the variables CWD and ECWD are decreased by an amount equal to the variable IEFF.

When current is first withdrawn from a battery, the active ions taking part in the reaction are gradually depleted at the reaction sites until the rate of usage is equal to the rate in which new ions are able to diffuse to the reaction sites. This depletion causes a voltage drop and it is this voltage drop which is referred to as the polarization voltage. The value of the polarisation voltage depends upon the current being withdrawn and it is associated with a long time constant. Similarly, after the discharge current has been removed, the polarization voltage decays slowly. It has been found that polarisation voltage VPOL is a complex function of time and current which may be expressed as follows:

$$VPOL = VP(1 - I - t/\tau)$$

where
$VP = 0.076 (IPEAK) 0.377$
and
$\tau = 29.3 - 4.71 \ln (IPEAK)$
where VP is the polarisation voltage as time t tends to infinity, IPEAK is the peak current and $\tau$ is the time constant.

Figure 17:
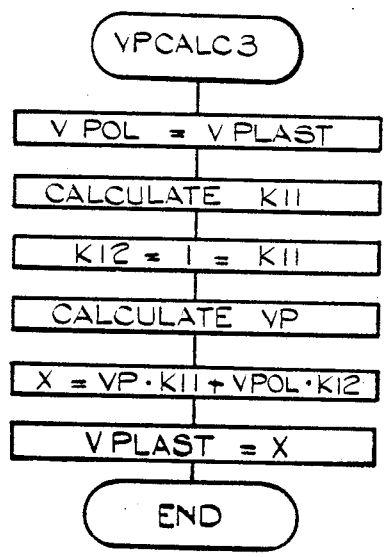
Figure 18:
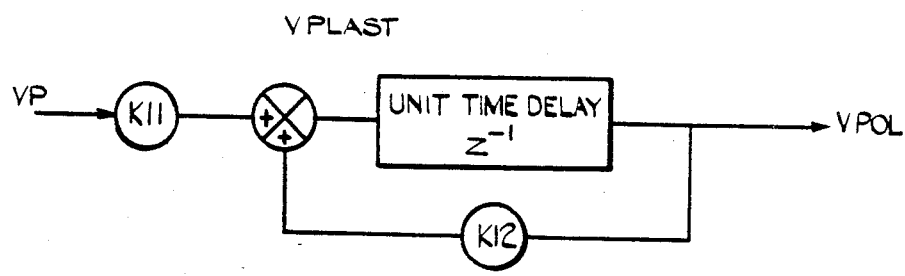

The sub-routine VPCALC3 which calculates the polarisation voltage VPOL is shown in FIG. 17 and this sub-routine simulates the filter shown in FIG. 18. This sub-routine and the filter use temporary variables VPLAST and X and also variables K11 and K12 which are defined as follows:

$$K11 = 1 - I - 0.1/\tau$$

$$K12 = 1 - K11$$

As the peak current IPEAK and the average current CURR are stored as negative values for discharge currents, the polarisation voltage normally has a negative value.

In general, the charge which may be withdrawn from a battery decreases with increasing discharge current because discharge is limited to the surfaces of the battery plates at high currents. In the sub-routine DISCHG3, the variable IEFF represents the discharge current corrected to take account of the rate of discharge. Peukert has shown that the variable IEFF is related to the variable CURR, which represents battery current, as follows:

$$IEFF = I2 (CURR/I2)^n$$

where I2 is the current which will discharge the battery in two hours and n is a constant having a typical value of 1.15 for lead acid batteries.

Figure 19:
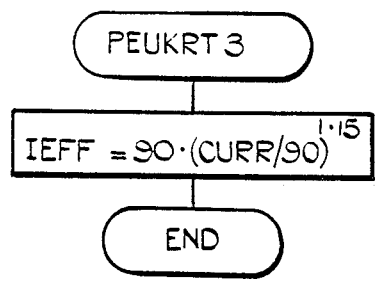

The value of IEFF is calculated in the sub-routine PEUKRT3, the flow chart of which is given in FIG. 19. This sub-routine uses the value 1.15 for the constant n and the constant I2 is set to a value of 90 A.

Figure 20:
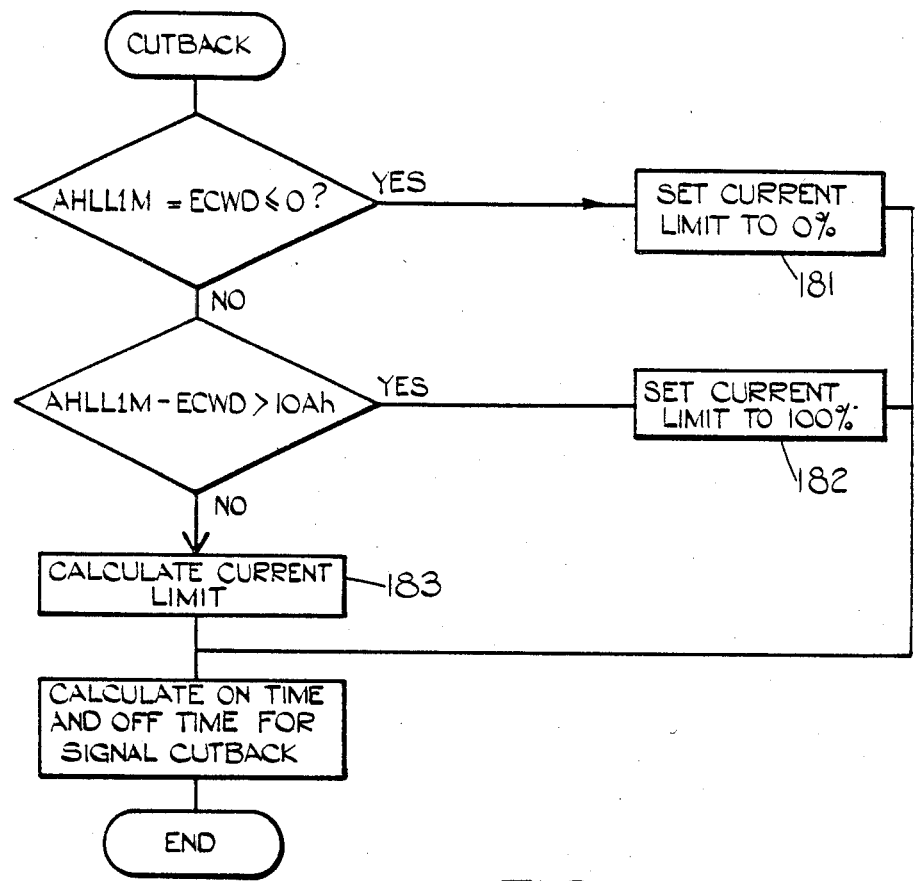

Referring now to FIG. 20, this is shown in the flow chart for the sub-routine CUTBACK. In this sub-routine, the mark space ratio of the signal CUTBACK is set in accordance with the state of charge of the battery. After entering this sub-routine, the quantity (AHLLIM-ECWD) which represents the charge remaining in the battery is examined. If it is equal to or less than zero, in a step 181 a variable representing the limit for the current supply to the motor is set to a value corresponding to 0% of the current demanded by the driver. If it is greater than 10Ah, the current limit variable is set in a step 182 to a value corresponding to 100% of the current demanded by the driver, and, if it is between 10 Ah and zero, the current limit viarable is set in a step 183 to an approximate value in a range which corresponds to the range of 100% to 40% of the current demanded by the driver. Lastly, in a step 184 the mark space ratio for the signal CUTBACK is set by calculating the on time and off time for this signal.

It should be noted that the remaining charge is calculated as the quantity (AHLLIM−ECWD). The reason for using the variable AHLLIM to calculate the state of charge is explained with reference to the sub-routine MDCALC3.

Figure 21A:
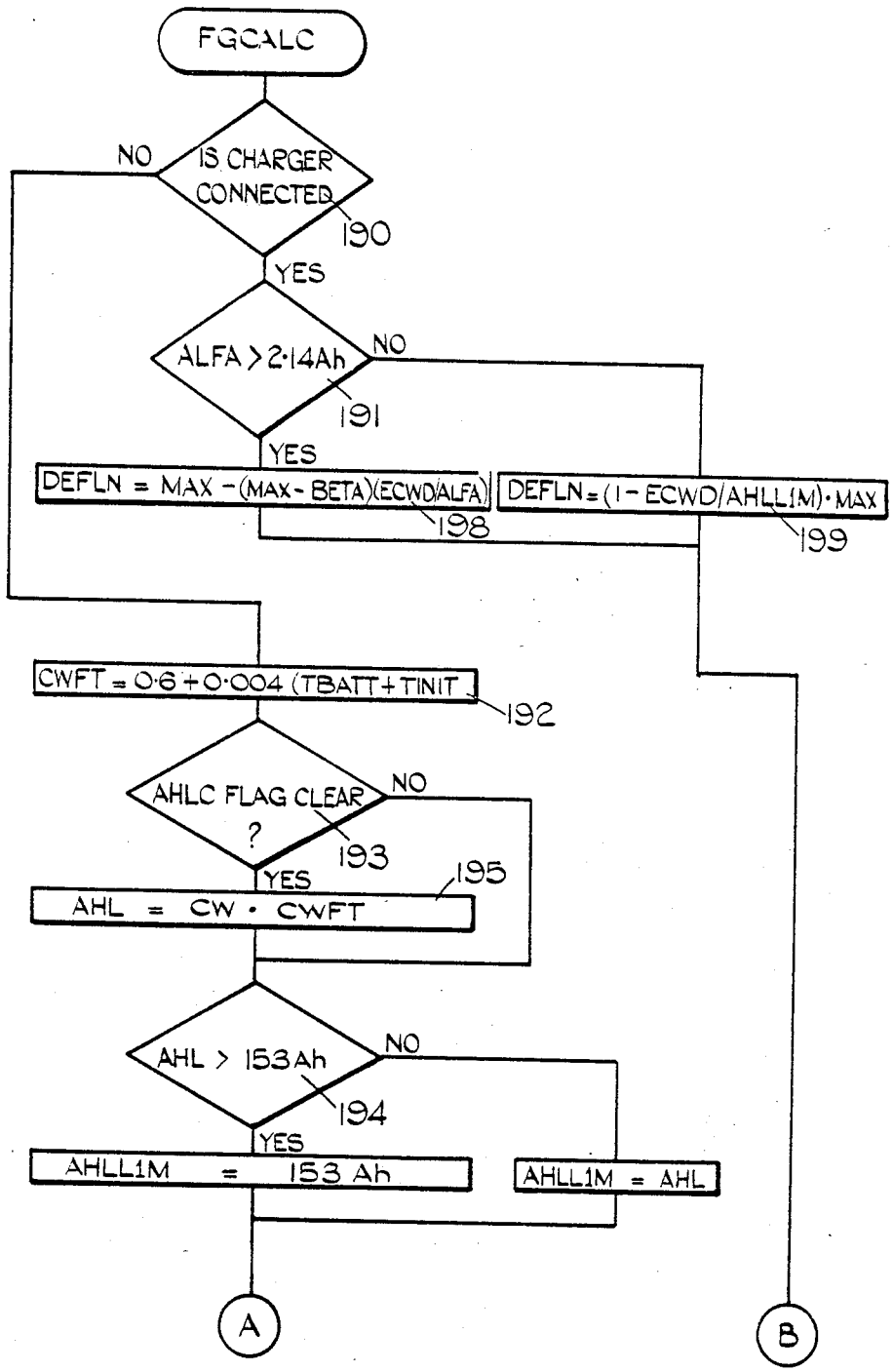
Figure 21B:
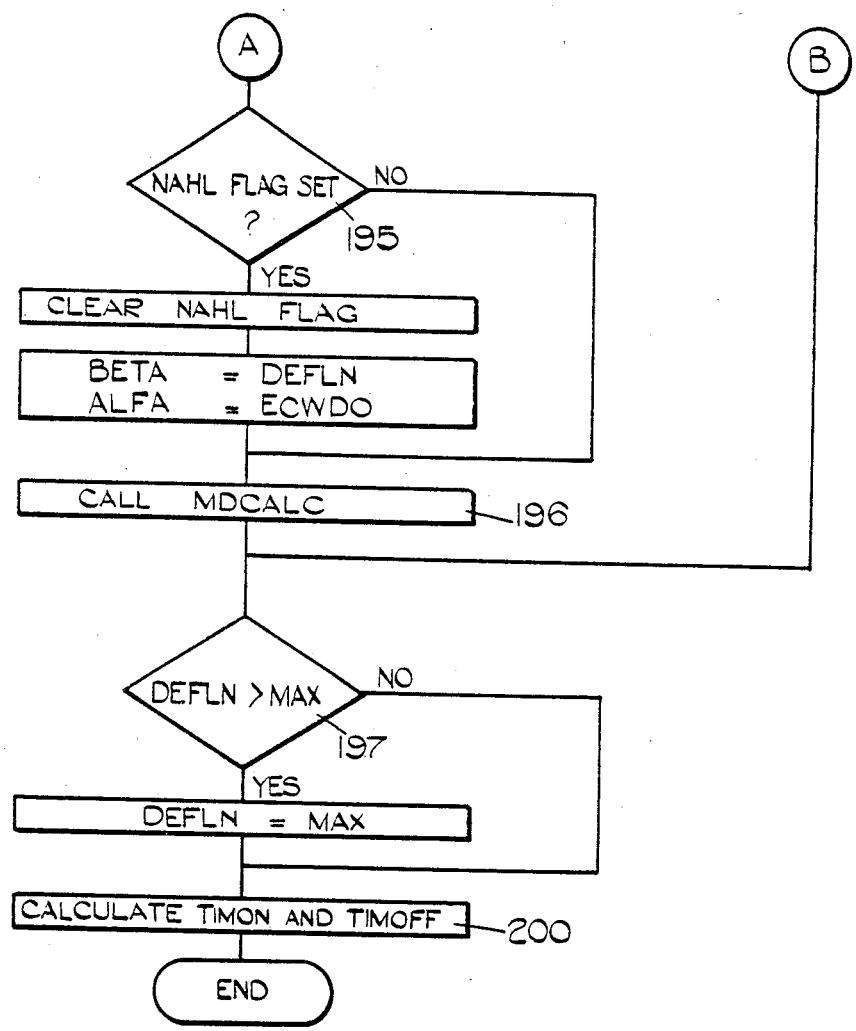

Referring now to FIG. 21, there is shown the flow chart for the sub-routine FGCALC. This is responsible for calculating the state of charge of the battery and storing the result as the variable DEFLN.

After this sub-routine has been entered, in an operation 190 a test is made to see if the charger is connected. If the charger is connected, the routine continues with a step 191 but otherwise the routine continues with an operation 192.

In operation 192, the variable CWFT is calculated as a function of the present temperature of the battery and the temperature of the battery at the time the vehicle power was switched on. Then, in operation 193, the flag AHLC is examined to see if the value of AHL was corrected during the last execution of a sub-routine DISCH3. If it was so corrected, then a jump is made to a step 194. If AHL has not been corrected, then it is calculated in an operation 195 by multiplying the variable CW by the variable CWFT. The variable CW represents the charge storage capacity of the battery at 30° C. By multiplying this by CWFT it is effectively derated by 0.8% per °C. below 30° C.

In operation 194, the variable AHL is examined to see if it is greater than 153 Ah. If it is greater than 153 Ah, the variable AHLLIM is set to 153 Ah but otherwise the variable AHLLIM is set to the present value of AHL. As mentioned above, the variable AHLLIM is used in the sub-routine MDCALC3 to calculate the state of charge of the battery. This variable needs to be calculated in the present sub-routine as it is only calculated in the sub-routine DISCH3 if a new value of AHL is calculated in the sub-routine DISCH3. The reason for using the variable AHLLIM to calculate the state of charge will be explained below.

In an operation 195, the flag NAHL is examined to see if a new value of AHL is available. If the flag is not set, then the sub-routine continues with an operation 196. If the flag is set, a new value of AHL is available and the present value of DEFLN is stored as the variable BETA and a variable ECWDO is stored as the variable ALFA before proceeding to operation 196. As will be explained with reference to the sub-routine MDCALC3 this results in re-scaling the meter 34 each time AHL is calculated during the programme DISCH3 to avoid a discontinuity in the meter reading. In step 196, the sub-routine MDCALC3 is called to calculate the variable DEFLN. The programme then proceeds with a step 197.

If it is found in step 190 that the charger is connected, in step 191 ALFA is compared with a value 2.14 Ah. If ALFA is greater than this value, then the variable DEFLN is calculated in accordance with the following equation as shown in step 198:

$$DEFLN = MAX - (MAX - BETA) \cdot (ECWD/ALFA)$$

In this equation, MAX is the value of DEFLN which corresponds to full state of charge.

If it is found in step 191 that ALFA is less than a constant, the variable DEFLN is calculated in accordance with the following equation as shown in step 199:

$$DEFLN = (1 - ECWD/AHLLIM) \cdot MAX$$

Thus, the variable DEFLN falls linearly to zero with ECWD during charging. After step 198 or 199, a jump is made to step 197. In step 197, the variable is examined and, if it is greater than MAX, it is set equal to MAX. Lastly, in a step 200 the variables TIMON and TIMOFF are calculated in accordance with the value of the variable DEFLN so that the mark space ratio of the signal FG represents the state of charge of the battery.

Figure 22:
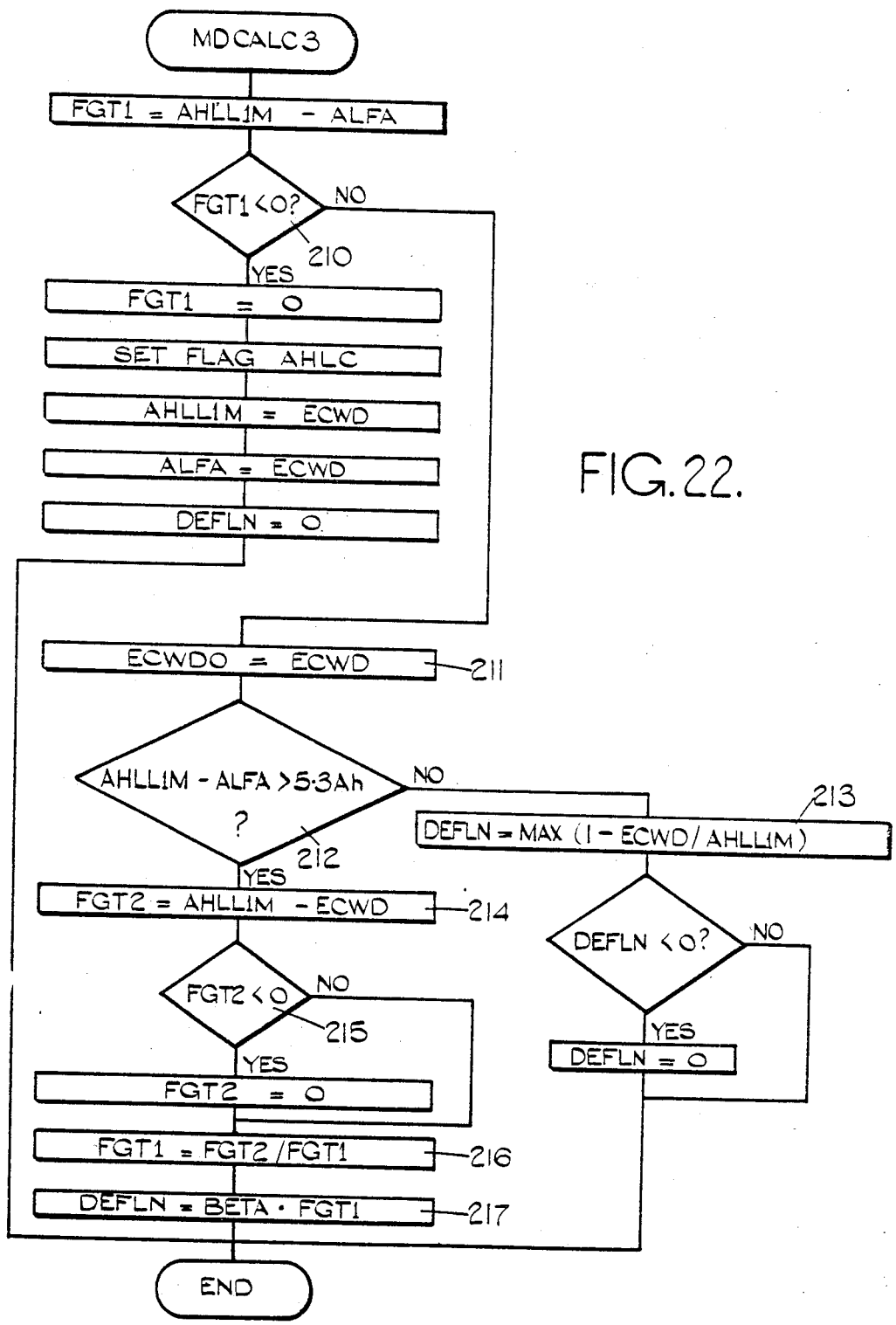

The flow chart for the sub-routine MDCALC3 is shown in FIG. 22. After this sub-routine has been entered, a variable FGT1 is calculated by subtracting ALFA from AHLLIM. Then, in a step 210, the variable FGT1 is examined and if it is positive a jump is made to a step 211. If it is found negative, then the variable FGT1 is set equal to zero, the flag AHLC is set, the variable AHLLIM is set to ECWD, the variable ALFA is set to ECWD, and the variable DEFLN is set to zero. A jump is then made to the end of the routine.

In step 211, the variable ECWD0 is set equal to ECWD. The variable ECWDO is used during the next execution of the routine DISCH3. Next, in a step 212, the difference between the variables ALFA and AHLLIM is examined. If this difference is less than 5.3 Ah, a jump is made to a step 213 and if it is greater than 5.3 Ah the programme continues with a step 214. In step 214, a variable FGT2 is calculated by subtracting ECWD from AHLLIM. Then, in a step 215, the variable FGT2 is examined and if it is less than zero it is set to zero. Next, in a step 216, the variable FGT1 is set equal to FGT2 divided by FGT1. Lastly, before jumping to the end of the sub-routine, the variable DEFLN is calculated as the product of BETA and FGT1.

Thus, the variable DEFLN is calculated in accordance with the following equation:

$$DEFLN = BETA \cdot (AHLLIM - ECWD)/(AHLLIM - ALFA)$$

Figure 23:
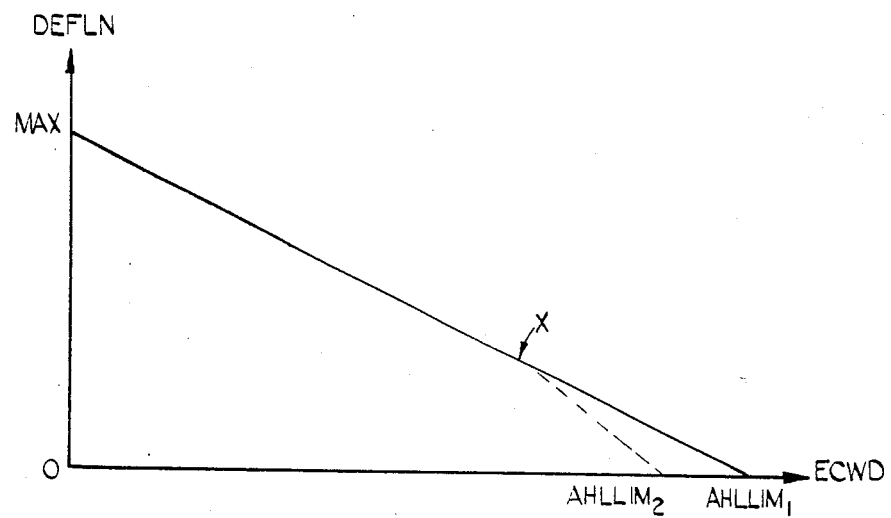

This equation is used to avoid discontinuity in the variable DEFLN when a new value for AHLLIM is calculated following the calculation of a new value for the variable AHL. As shown in FIG. 23, if discharge commences with a fully charged battery and with the variable AHLLIM equal to $AHLLIM_1$, then the variable DEFLN will fall linearly to zero as the value of ECWD increases to $AHLLIM_1$. Then, if at a point Z a new value of AHLLIM is calculated at $AHLLIM_2$, the variable DEFLN will subsequently fall to zero as the variable ECWD rises to a value of $AHLLIM_2$. If the variable DEFLN were simply calculated as being proportional to $(1 - ECWD/AHL)$ a discontinuity will occur at point X.

If it is found in step 212 that the difference between ALFA and AHLLIM is less than 5.3 Ah, DEFLN cannot be calculated accurately using the expression given in step 217. Consequently, in step 213, the variable DEFLN is calculated in accordance with the following equation:

$$DEFLN = MAX (1 - ECWD/AHLLIM)$$

then, the variable DEFLN is examined and, if it is less than zero, it is set to zero. A jump is then made to the end of the sub-routine.

As explained with reference to the sub-routine FGCALC3, in order to calculate the value of the variable AHLLIM, the value of the variable AHL is compared with a value of 153 Ah and the variable AHLLIM is then set to the lower of these two values. The value of 153 Ah corresponds to 85% of the nominal charge storage capacity of 180 Ah of the battery when new. The variable DEFLN which represents the state of charge is then calculated in accordance with the value of the variable AHLLIM. The reason for using the variable AHLLIM to calculate the state of charge instead of the variable AHL will now be explained.

During the first part of the life of the battery, the actual charge storage capacity will be greater than 153 Ah. Consequently, during this part of the life of the battery, the end of discharge will be indicated on a discharge corresponding to 153 Ah. It has been found that limiting discharge to 85% of the nominal charge storage capacity of the battery when new can significantly extend the battery life compared with the case where the battery is fully repeatedly discharged. As the life of the battery progresses, its charge storage capacity falls and when it falls below 153 Ah it is clearly necessary to set the varible AHLLIM to the actual charge storage capacity. In order to avoid the need to replace the battery at an early stage, it is unlikely that a vehicle operator would use a battery on a vehicle whose duty cycle required a discharge of more than 153 Ah or 85% of the nominal new charge storage capacity of the battery. Therefore, limiting the discharge to this value should not cause an inconvenience.

As stated with reference to the routine DISCH3, during the last part of discharge the remaining charge and also the actual charge storage capacity of the battery are calculated as a function of the battery voltage. When the battery voltage falls to a value VZ the remaining charge is zero and so this voltage corresponds to the end of the discharge point. It has been found that if VZ is set to a value of 195 volts, there is an acceptable probability that no more than two cells would have gone into reversal. Consequently, the total battery voltage is a satisfactory parameter for calculating the actual charge storage capacity of the battery. Therefore, during the last part of the life of the battery when the variable AHLLIM is set equal to the actual charge storage capacity of the battery, an accurate evaluation may be made of the state of charge.

In United Kingdom patent application No. 2080550, there is described a method for calculating the remaining charge of the battery and the actual state of charge. In this method, the battery is divided into a number of sub-packs and the valuation of these two variables is based on the voltage of the sub-pack having the lowest voltage. If desired, this method of calculating the remaining charge and the actual charge storage capacity may be used in the present invention.

By way of example, the various constants described above may have the following value:

K1 = 2.778 Ah/V
K2 = 15 Ah
K3 = 5 Ah/V
VX = 208 V
VY = 202 V
VZ = 196.6 V
ETA1C = 100%
ETA2C = 90%
ETA3C = 80%
ETA1R = 90%
ETA2R = 100%

We claim:

1. A battery state of charge evaluator comprising a battery, means responsive to the battery for determining a value representing the present maximum charge storage capacity of the battery, means for comparing the present maximum charge storage capacity value with a predetermined value (representing a predetermined percentage of) lower than the nominal maximum charge storage capacity of the battery when new and selecting the lower of said two values, means responsive to the battery current for producing a current value, means for integrating the current value with respect to time to obtain a value representing the charge withdrawn from the battery, and means for determining the state of charge of the battery from said lower value and the charge withdrawn value.

2. An evaluator as claimed in claim 1, in which the battery has a positive terminal and a negative terminal and further including means for producing a voltage value representing the voltage difference between said positive and negative terminals, means for computing the remaining charge of the battery as a function of the voltage value and producing a remaining charge value, and means for computing the present maximum charge storage capacity of the battery by summing the remaining charge value and the charge withdrawn value.

3. An evaluator as claimed in claim 2, further including means for calculating a polarisation voltage value as a function of time and the current value, and means for correcting the voltage value to compensate for the polarisation voltage.

4. A method of evaluating the state of charge of a battery comprising determining a value representing the present maximum charge storage capacity of the battery, comparing the present maximum charge storage capacity value with a predetermined value (representing a predetermined percentage of) lower than nominal maximum charge storage capacity of the battery when new and selecting the lower of said two values, measuring the battery current to produce a current value, integrating the current valve with respect to time to obtain a value representing the charge withdrawn from the battery, and determining the state of charge of the battery as a function of said lower value and the charge withdrawn value.

5. A method as claimed in claim 4, in which the battery has a positive terminal and a negative terminal, said method further comprising producing a value representing the voltage difference between said positive and negative terminals, computing the remaining charge of the battery as a function of the voltage value and producing a remaining charge value, and computing the present maximum charge storage capacity of the battery by summing the remaining charge value and the charge withdrawn value.

6. A combined motor control and battery state of charge evaluator system for an electric vehicle having a main electric traction motor, said system comprising a traction battery for providing power to the traction motor, means for controlling the supply of current to the traction motor, means responsive to the battery for determining a value representing the maximum present charge storage capacity of the battery, means for comparing the present maximum charge storage capacity value with a predetermined value lower than the nominal maximum charge storage capacity of the battery when new and selecting the lower of said two values, means responsive to the battery current for producing a current value, means for integrating the current value with respect to time to obtain a value representing the charge withdrawn from the battery, and means for determining the state of charge of the battery from said lower value and the charge withdrawn valve, the state of charge evaluator producing a signal to the current control means when the state of charge falls below a predetermined value and the current control means restricting the current supply on receiving this signal.

7. A system as claimed in claim 6, in which the current supply to the traction motor is restricted to a predetermined percentage of the current demanded by the driver, said predetermined percentage being progressively reduced as the state of charge falls from said predetermined value to zero.

8. A method of discharging a traction battery supplying current to the main traction motor of an electric vehicle, said method comprising determining a value representing the present maximum charge storage capacity of the battery, comparing the present maximum charge storage capacity value with a predetermined value (representing a predetermined percentage of) lower than the nominal maximum charge storage capacity of the battery when new and selecting the lower of said two values, measuring the battery current to produce a current value, integrating the current value with respect to time to obtain a valve representing the charge withdrawn from the battery, and determining the state of charge of the battery as a function of said lower value and the charge withdrawn value, and restricting the current supply to the traction motor when the state of charge as so determined falls below a predetermined value.

9. A method as claimed in claim 8, in which the current supply to the traction motor is restricted to a predetermined percentage of the current demanded by the driver, said predetermined percentage being progressively reduced as the state of charge falls from said predetermined value to zero.

10. A battery state of charge evaluator as claimed in claim 1 in which said predetermined value lower than the nominal maximum charge storage capacity of the battery when new is equal to 85% of said nominal maximum charge storage capacity.

11. A method of evaluating the state of charge of a battery as claimed in claim 4 in which said predetermined value lower than the nominal maximum charge storage capacity of the battery when new is equal to 85% of said nominal maximum charge storage capacity.

12. A combined motor control and battery state of charge evaluator system as claimed in claim 6 in which said predetermined value lower than the nominal maximum charge storage capacity of the battery when new is equal to 85% of said nominal maximum charge storage capacity.

13. A method of discharging a traction battery as claimed in claim 8 in which said predetermined value lower than the nominal maximum charge storage capacity of the battery when new is equal to 85% of said nominal maximum charge storage capacity.

* * * * *